United States Patent
Rao et al.

(10) Patent No.: US 7,224,201 B2
(45) Date of Patent: May 29, 2007

(54) LEVEL CONVERTER

(75) Inventors: Rajashekhar Rao, München (DE); Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/970,664

(22) Filed: Oct. 22, 2004

(65) Prior Publication Data
US 2005/0156652 A1 Jul. 21, 2005

(30) Foreign Application Priority Data
Oct. 23, 2003 (DE) ............... 103 49 464

(51) Int. Cl.
*H03L 5/00* (2006.01)
(52) U.S. Cl. .................. 327/333; 327/68
(58) Field of Classification Search ........ 327/333; 326/68, 80
See application file for complete search history.

(56) References Cited

U.S. PATENT DOCUMENTS

| | | | | |
|---|---|---|---|---|
| 4,450,371 A | * | 5/1984 | Bismarck | 326/17 |
| 5,019,724 A | * | 5/1991 | McClure | 326/29 |
| 5,659,258 A | * | 8/1997 | Tanabe et al. | 326/68 |
| 5,680,064 A | * | 10/1997 | Masaki et al. | 326/81 |
| 6,954,099 B2 | * | 10/2005 | Brox | 327/333 |
| 2001/0000989 A1 | | 5/2001 | Tomishima et al. | |
| 2002/0175706 A1 | | 11/2002 | Kouzuma | |
| 2003/0080796 A1 | * | 5/2003 | Maejima et al. | 327/333 |

* cited by examiner

*Primary Examiner*—Long Nguyen
*Assistant Examiner*—Ryan Jager
(74) *Attorney, Agent, or Firm*—Morrison & Foerster LLP

(57) ABSTRACT

The invention relates to a level converter for converting a signal (in) comprising a first voltage level (Vint) and supplied to the level converter, to a signal (Out) including a second voltage level (Vsupply) differing from the first voltage level (Vint). The level converter includes an amplifier device. The level converter is additionally supplied with a signal obtained from the signal (in) and delayed for compensating for distortions contained in said signal (in).

17 Claims, 4 Drawing Sheets

Prior Art

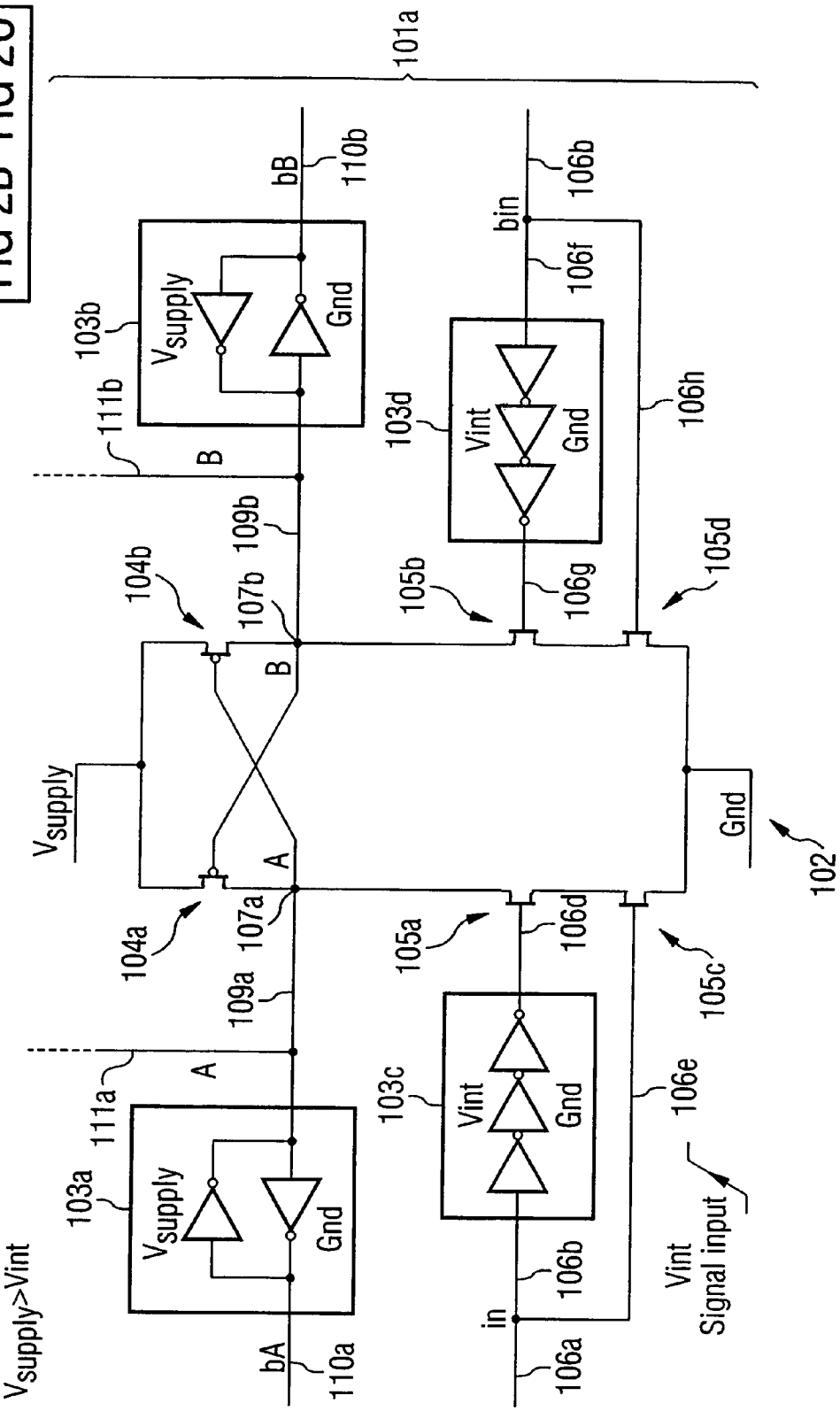

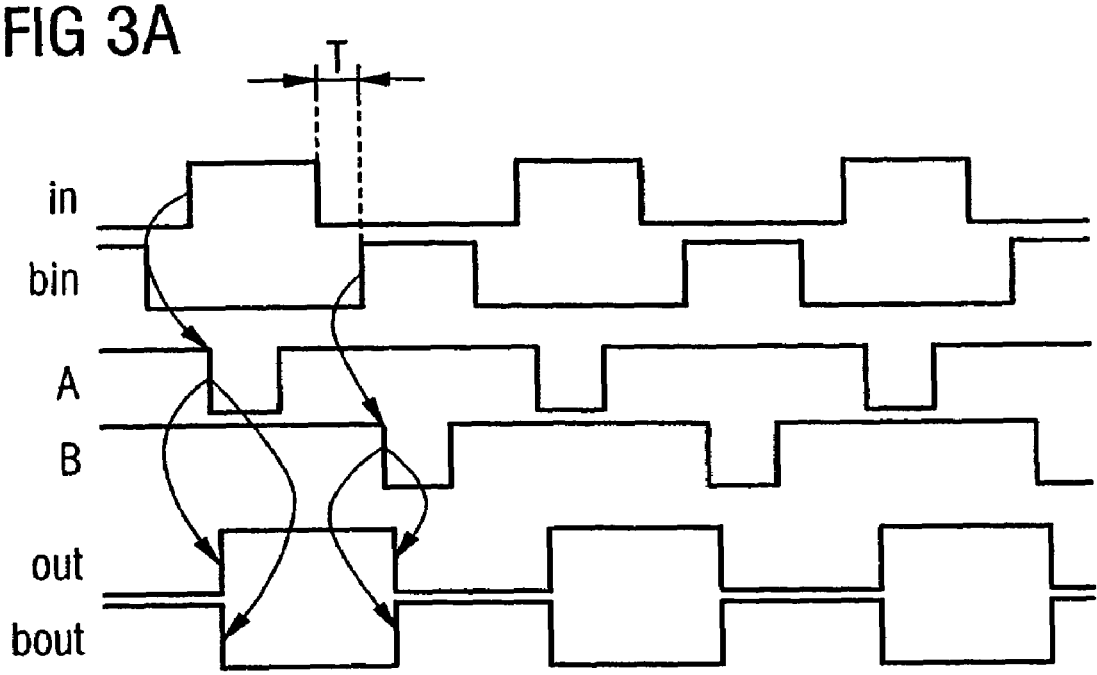
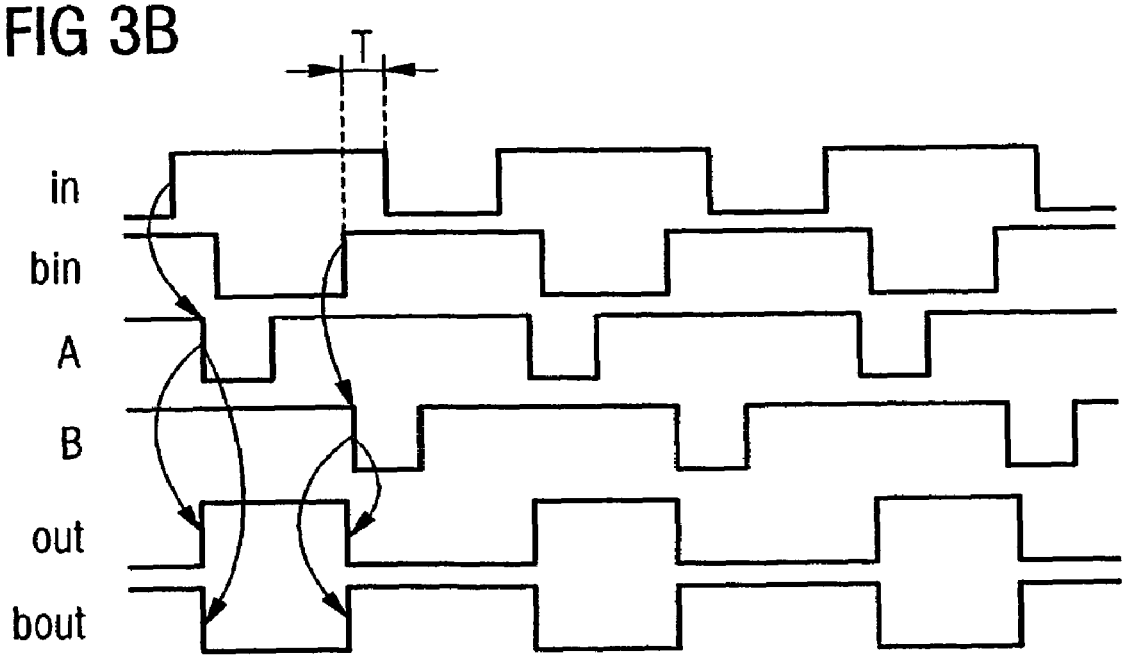

LEVEL CONVERTER

CLAIM FOR PRIORITY

This application claims priority to German Application No. 10349464.2 filed Oct. 23, 2003, which is incorporated herein, in its entirety, by reference.

TECHNICAL FIELD OF THE INVENTION

The invention relates to a level converter for converting a signal (in) including a first voltage level (Vint) and supplied to the level converter, to a signal (Out) including a second voltage (Vsupply).

BACKGROUND OF THE INVENTION

With semiconductor devices, in particular with memory devices such as DRAMS (DRAM=Dynamic Random Access Memory or dynamic read-write memory, respectively), a voltage level used internally in the device may differ from an external voltage level used outside the device.

In particular, the internally used voltage level may be smaller than the externally used voltage level—for instance, the internally used voltage level may be 1.8 V, and the voltage level used externally may be 2.5 V.

The reason for this may, for instance, may be that the external voltage supply is subject to relatively strong fluctuations, and, therefore—in order that the device can be operated without fault—has to be converted, by a voltage regulator, to an internal voltage (that is subject to relatively minor fluctuations only and that is regulated at a particular, constant value).

By the use of voltage regulators, a loss of voltage may occur, which may result in the voltage level used internally in the device being smaller than the external voltage level.

An internal voltage level that is reduced vis-à-vis the externally used voltage level has the advantage of reducing power loss in the semiconductor device.

If a lower voltage level is used internally in the device than is used externally, the signals generated internally in the device typically—before being output outside—are conconverted to corresponding, higher-level signals by so-called level converters.

Such level converters may, for instance, an amplifier circuit that includes cross-coupled p- or n-channel field effect transistors.

By using the amplifier circuit, internal, low-level signals generated in the device can leave afflicted with certain delay times—be converted to corresponding higher-level signals.

However, the delay time occurring with a positive edge of an internal signal may differ from the delay time occurring with a negative edge of the internal signal. The result thereof is that the higher-level signals output by the amplifier circuit are distorted.

To compensate for this effect, the signals output by the amplifier circuit may be supplied to a driver stage comprising a plurality of, e.g. two, inverters connected in series.

The inverters are designed such that a compensation of the distortions contained in the signals output by the amplifier circuit is achieved.

The driver stage does, however, result in a relatively high-additional—signal delay; furthermore, the above-mentioned signal distortions may, for instance due to changes in the characteristics of the level converter devices caused by temperature fluctuations, in general be compensated for only incompletely by a level converter of the above-described type.

SUMMARY OF THE INVENTION

The present invention provides a novel level converter.

In accordance with a basic idea of the invention, a level converter is provided for converting a signal (in) comprising a first voltage level (Vint) and supplied to the level converter, to a signal (Out) comprising a second voltage level (Vsupply) that differs from the first voltage level (Vint), wherein the level converter includes an amplifier device, and wherein, for compensating distortions contained in the signal (in), the level converter is additionally also supplied with a signal obtained from the signal (in) and delayed by a delay means.

In a particularly advantageous manner, for generating the signal (Out) having the amplitude of the second voltage level (Vsupply), except for a first output signal (B) of the amplifier device, a second amplifier device output signal (A) differing therefrom is additionally used.

Preferably, a first transmission gate is triggered with the first amplifier device output signal (B), and/or a signal derived therefrom, and a second transmission gate with the second amplifier device output signal (A), and/or a signal derived therefrom.

With such a level converter it may, for instance, be achieved that distortions—that are already contained in the signal (in) supplied to the level converter, and/or are caused by the amplifier circuit—can be compensated for almost completely.

BRIEF DESCRIPTION OF THE DRAWINGS

The invention can be understood by reference to the Detailed Description of the Invention when taken together with the attached drawings, wherein:

FIG. 2a is a schematic representation of a first section of a circuit arrangement of a level converter in accordance with an embodiment of the present invention;

FIG. 3a is a schematic representation of the time characteristics of the input and output signals of the amplifier circuit contained in the level converter illustrated in FIGS. 2a, 2b, 2c, and of the straightened output signal of the level converter, with a first, exemplary characteristic of the input signals; and FIG. 3b is a schematic representation of the time characteristics of the input and output signals of the amplifier circuit contained in the level converter illustrated in FIGS. 2a, 2b, 2c, and of the straightened output signal of the level converter, with a second, exemplary characteristic of the input signals.

DETAILED DESCRIPTION OF THE INVENTION

Figure 1:
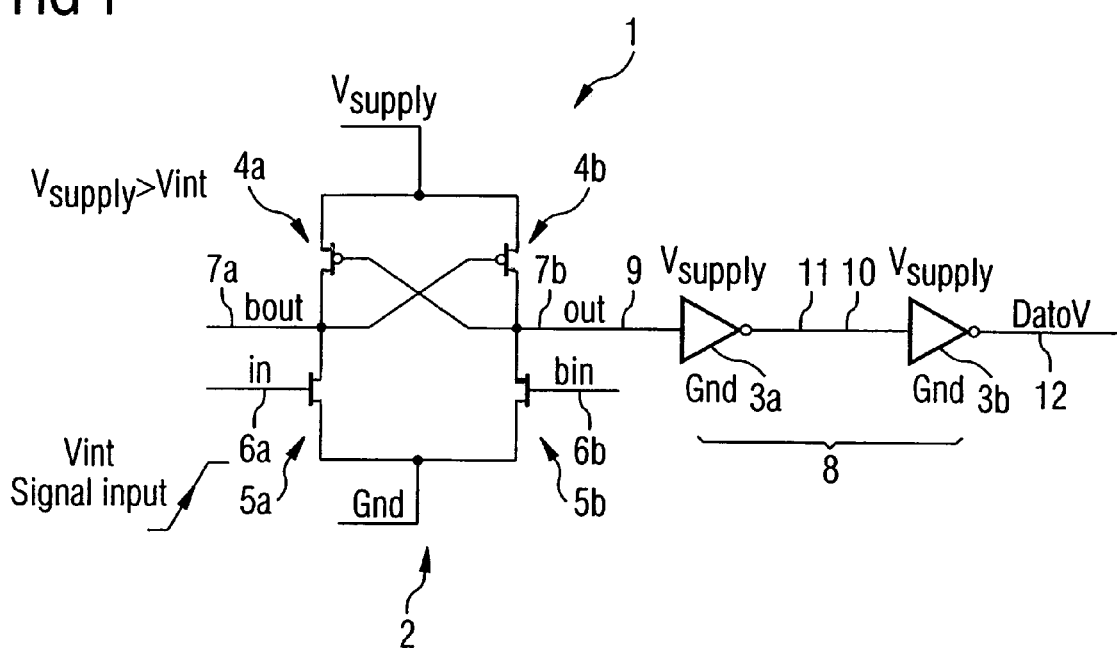
FIG. 1 is a schematic representation of a typical circuit arrangement of a level converter.

FIG. 1 shows a schematic representation of a typical circuit arrangement of a level converter 1. The level converter 1 is incorporated in a DDR memory device—that is, for instance, based on CMOS technology. It serves to convert an internal voltage level (Vint) used inside the memory device to an external voltage level (Vsupply) used outside the memory device, wherein the internally used voltage level (Vint) is smaller than the externally used voltage level (Vsupply). The internal voltage level (Vint) may, for instance, be 1.8 V, and the external voltage level (Vsupply) may, for instance, be 2.5 V.

As is illustrated in FIG. 1, the level converter 1 includes an amplifier circuit 2, and a driver stage 8 with a first and a second inverter 3a, 3b (and, alternatively, with further, not illustrated inverters).

The amplifier circuit 2 includes transistors, namely a first and a second p-channel field effect transistor 4a, 4b (here: two p-channel MOSFETs 4a, 4b), and a first and a second n-channel field effect transistor 5a, 5b (here: two n-channel MOSFETS 5a, 5b).

The source of the first n-channel field effect transistor 5a is connected to the ground (Gnd). Correspondingly, the source of the second n-channel field effect transistor 5b is also connected to the ground (Gnd).

Furthermore, the gate of the first n-channel field effect transistor 5a is connected with a first input 6a of the amplifier circuit 2, and the gate of the second n-channel field effect transistor 5b is connected with a second amplifier circuit input 6b.

The drain of the first n-channel field effect transistor 5a, the gate of the second p-channel field effect transistor 4b, and the drain of the first p-channel field effect transistor 4a are connected to a first output 7a of the amplifier circuit 2. Correspondingly, a second amplifier circuit output 7b is connected with the drain of the second n-channel field effect transistor 5b, with the gate of the first p-channel field effect transistor 4a, and with the drain of the second p-channel field effect transistor 4b.

The source of the first and of the second p-channel field effect transistor 4a, 4b is connected to the supply voltage. This supply voltage has, as has already been explained above, a relatively high voltage level (Vsupply) as compared to the internally used voltage.

At the first input 6a of the amplifier circuit 2, a first internal signal (in) of the DRAM memory device is applied, and at the second input 6b of the amplifier circuit 2, a second device-internal signal (bin) is applied.

The first and second internal signals (in or bin, respectively) may be complementary, or substantially complementary to one another, respectively.

The "logically high" states of the first or second internal signal (in or bin, respectively) should—in the ideal case—be substantially of equal duration as their "logically low" states. The internal signals (in or bin, respectively) include—as has already been explained above—the relatively low, internally used voltage level (Vint) as compared to the externally used voltage level (Vsupply).

The amplifier circuit 2 converts the internal signal (in) applied at the first input 6a of the amplifier circuit 2 to a signal (out) that corresponds to the signal (in) and can be tapped at the second output 7b of the amplifier circuit 2 and has the above-mentioned—relatively high—external voltage level (Vsupply).

When the internal signal (in) applied at the first input 6a of the amplifier circuit 2 changes from a "logically low" state to a "logically high" state (and the complementary internal signal (bin) from a state "logically high" to a state "logically low"), the corresponding signal (out) that can be tapped at the output 7b of the amplifier circuit 2 changes, due to internal signal running times in the amplifier circuit 2, its state from "logically low" to "logically high" after a certain delay time d1' only.

Correspondingly, when the state of the internal signal (in) changes from "logically high" to "logically low" (and the complementary internal signal (bin) changes from "logically low" to "logically high"), the corresponding signal (out) that can be tapped at the output 7b changes its state from "logically high" to "logically low" after a certain delay time d2' only.

The delay time d1'—occurring with a positive edge of the internal signal (in)—differs, due to differing signal running times in the delay circuit 2, from the delay time d2' occurring with a negative edge of the internal signal (in). The result thereof is that the signal (out) that can be tapped at the output 7b is distorted (in particular, that its "logically low" state lasts longer than its "logically high" state—and is not, as desired, of substantially equal duration).

In order to compensate for this effect, in the level converter 1 the signal (out) that can be tapped at the output 7b of the amplifier circuit 2 is supplied, via a line 9, to an input of the first inverter 3a of the driver stage 8, the output 11 of which is connected, via a line 10, to an input of the second inverter 3b.

When the state of the signal (out) that can be tapped at the output 7b of the amplifier circuit changes from "logically low" to "logically high" (-or, vice versa, when the state of the signal (out) changes from "logically high" to "logically low"-) (after respective delay times differing from one another), the signal at the output 11 of the first inverter 3a changes its state from "logically high" to "logically low" (-or, vice versa, from "logically low" to "logically high"-), and, consequently, the output signal (DatoV) that can be tapped at an output 12 of the second inverter 3b changes from a state "logically low" to a state "logically high", or, vice versa, from a state "logically high" to a state "logically low" (again after respective delay times differing from one another).

The inverters 3a, 3b—in particular the delay times caused thereby, which are different for positive and negative signal edges—are designed such that the delay time d1 occurring altogether between a positive signal edge of the signal (in) applied at the input 6a of the amplifier circuit 2 and a corresponding, positive signal edge of the output signal (DatoV) output at the output 12 of the second inverter 3b is substantially as large as the delay time d2 occurring altogether between a negative signal edge of the signal (in) and a corresponding, negative signal edge of the output signal (DatoV).

The result thereof is a compensation of the distortion contained in the signal (out) applied at the output 7b of the amplifier circuit 2 (so that e.g. the "logically low" state of the output signal (DatoV) applied at the output 12 of the second inverter 3b then last substantially as long as its "logically high" state).

However, the driver stage 8 leads to a relatively high—additional—signal delay; furthermore, for instance due to component inaccuracies, or due to changes in the characteristics of the components used that are caused by temperature fluctuations, the signal distortion can, in general, be compensated for only incompletely by a level converter of the above-described type.

Further problems may occur when—deviating from the above-mentioned "ideal case", and as illustrated by way of example in FIG. 3a, top, and FIG. 3b, top—the "logically high" and the "logically low" states of the first or the second internal signal (in or bin, respectively) are of a differently long duration.

If—as is, for instance, illustrated in FIG. 3a, top—the "logically high" state of the signals in, bin lasts shorter than the "logically low" state, both the first signal in and the second signal bin are—as results from FIG. 3a—"logically low" during a particular period T, which results in a "floating" of the signals bout, out that are output at the outputs 7a, 7b.

If—vice versa, and as is illustrated, for instance, in FIG. 3b, top—the "logically high" state of the signals in, bin lasts longer than the "logically low" state, both the first signal in and the second signal bin are—as results from FIG. 3b—"logically high" during a particular period T, which results in that the outputs 7a, 7b are—simultaneously—pulled down.

FIG. 2a is a schematic representation of a first section 101a of a circuit arrangement of a level converter in accordance with an embodiment of the present invention.

The level converter is incorporated into a semiconductor device that is, for instance, based on CMOS technology, in particular a DRAM memory device (e.g. a DDR-DRAM ("Double Data Rate" DRAM or DRAM with double data rate, respectively)), and may especially be used for an OCD device of the DRAM memory device (OCD=Off Chip Driver), or e.g. for a DLL device (DLL=Delay Locked Loop).

The level converter converts an internal voltage level (Vint) used inside the DRAM memory device to an external voltage level (Vsupply) used outside the memory device, wherein the internally used voltage level (Vint) is smaller than the externally used voltage level (Vsupply).

The internal voltage level (Vint) may, for instance, be 1.8 V—or, alternatively, e.g. 1.5 V or 1.4 V—, and the external voltage level (Vsupply) may, for instance, be 2.5 V—or, alternatively, e.g. 1.8 V or 2.0 V.

In accordance with FIG. 2a, the first section 101a of the level converter includes an amplifier circuit 102 and—as will be explained in detail in the following—two input delay means 103c, 103d, and two output switching elements 103a, 103b (here: two latches 103a, 103b).

Figure 2C:
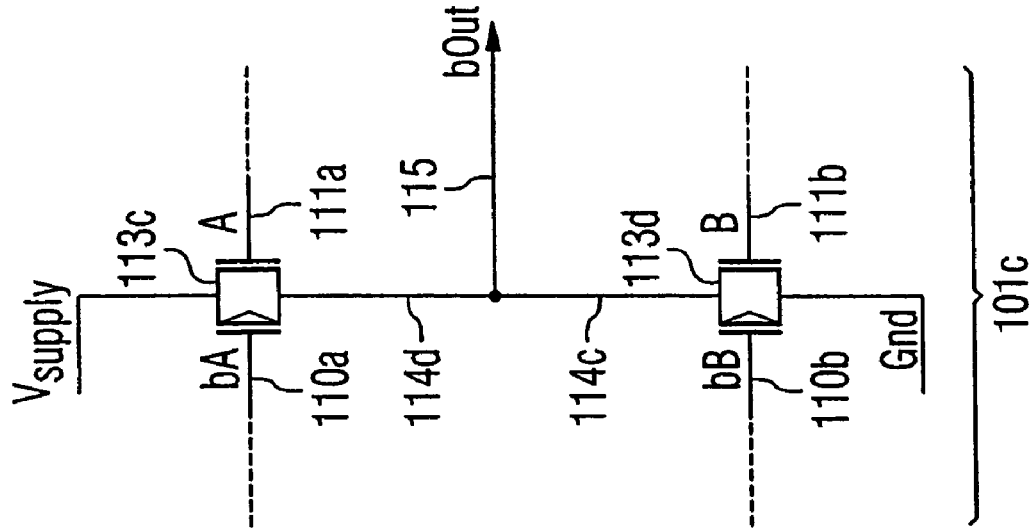
FIG. 2c is a schematic representation of a third section of the circuit arrangement of the level converter in accordance with the embodiment of the present invention.
Figure 2B:
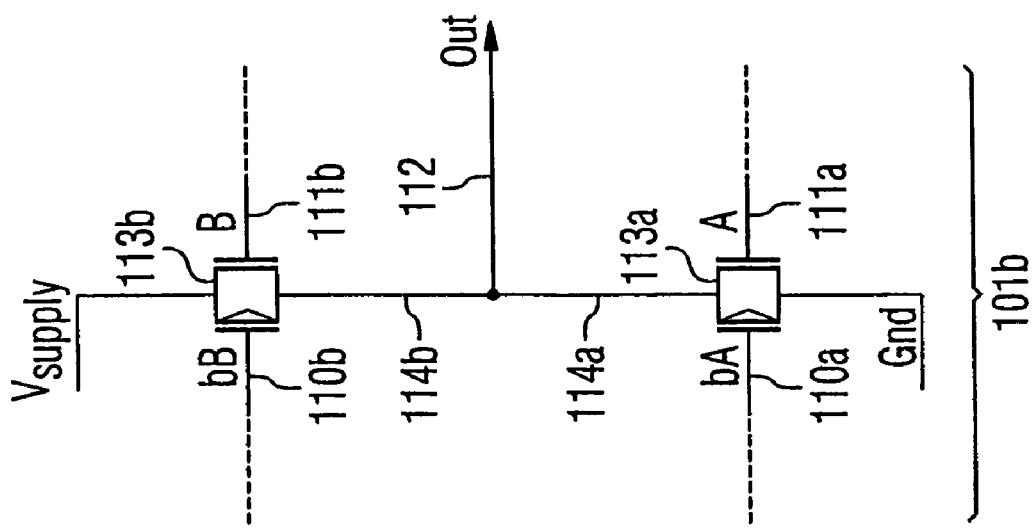
FIG. 2b is a schematic representation of a further section of the circuit arrangement of the level converter in accordance with the embodiment of the present invention.

Furthermore, a second level converter section 101b—illustrated in FIG. 2b—includes two transmission gates 113a, 113b, and a third level converter section 101c—illustrated in FIG. 2c—also includes two transmission gates 113c, 113d.

Referring again to FIG. 2a, the amplifier circuit 102 provided in the level converter includes a plurality of cross-coupled transistors, namely a first and a second p-channel field effect transistor 104a, 104b (here: two p-channel MOSFETs 104a, 104b), furthermore a first and a second n-channel field effect transistor 105a, 105b (here: two n-channel-MOSFETs 105a, 105b), and a third and fourth n-channel field effect transistor 105c, 105d (here: two further n-channel MOSFETs 105c, 105d).

The source of the third n-channel field effect transistor 105c is connected to the ground (Gnd). Correspondingly, the source of the fourth n-channel field effect transistor 105d is also connected to the ground (Gnd).

Furthermore, the gate of the third n-channel field effect transistor 105c is—via a line 106e—connected with a first input 106a of the amplifier circuit 102, and the gate of the fourth n-channel field effect transistor 105d is—via a line 106h—connected with a second amplifier circuit input 106b.

As results further from FIG. 2a, the source of the first n-channel field effect transistor 105a is connected to the drain of the third n-channel field effect transistor 105c. Correspondingly, the source of the second n-channel field effect transistor 105b is connected with the drain of the fourth n-channel field effect transistor 105d.

The gate of the first n-channel field effect transistor 105a is, via a line 106d, connected with the output of the input delay means 103c, the input of which is—via a line 106c—connected to the first input 106a of the amplifier circuit 102.

Correspondingly similar, the gate of the second n-channel field effect transistor 105b is—via a line 106g—connected with the output of the input delay means 103d, the input of which is—via a line 106f—connected to the second input 106b of the amplifier circuit 102.

In accordance with FIG. 2a, each of the input delay means 103c, 103d includes a plurality of (in particular an odd number, here: three) inverters connected in series.

The drain of the first n-channel field effect transistor 105a, the gate of the second p-channel field effect transistor 104b, and the drain of the first p-channel field effect transistor 104a is connected to a first output 107a of the amplifier circuit 102. Correspondingly, a second amplifier circuit output 107b is connected with the drain of the second n-channel field effect transistor 105b, the gate of the first p-channel field effect transistor 104a, and the drain of the second p-channel field effect transistor 104b.

The source of the first and second p-channel field effect transistors 104a, 104b is connected to a supply voltage which—as has already been explained above—has a relatively high voltage level (Vsupply) (as compared to the internally used voltage).

A first internal signal (in) of the DRAM memory device is applied at the first input 106a of the amplifier circuit 102, and a second device-internal signal (bin) is applied at the second input 106b of the amplifier circuit 102.

The first and second internal signals (in and bin) are complementary to one another. The first and second signals may, for instance, be differential clock signals (CLK, bCLK) that are complementary to one another, or any other signals.

The "logically high" states of the first or the second internal signal (in or bin, respectively) may, for instance, last substantially as long as their "logically low" states, or—as is illustrated in FIG. 3a, top—the "logically high" state of the signals in, bin may (for instance, due to signal distortions) be shorter than the "logically low" state, or—as is illustrated in FIG. 3b, top—the "logically high" state of the signals in, bin may last longer than the "logically low" state, etc.

As has already been explained above, the internal signals (in and bin) have—as compared to the externally used voltage level (Vsupply)—the relatively low, internally used voltage level (Vint).

The amplifier circuit 102 converts the internal signal (in) applied at the fist amplifier circuit input 106a to a corresponding signal (B) that can be tapped at the second output 107b of the amplifier circuit 102 (and the internal signal (bin) applied at the second amplifier circuit input 106b is converted to a corresponding signal (A) that can be tapped at the first output 107a of the amplifier circuit 102).

The signals (A or B, respectively) that can be tapped at the first and at the second amplifier circuit output 107a, 107b comprise the external voltage level (Vsupply) that is, as compared to the voltage level (Vint) used with the internal signals (in or bin, respectively), relatively high.

By the—odd—number of inverters contained in the input delay means 103c, 103d it is achieved that—after a particular delay time T1 caused by the input delay means 103c, 103d—inverse input signals are applied at the line 106d and the line 106e (i.e. at the gate of the n-channel field effect transistor 105a and at the gate of the n-channel field effect transistor 105c), or at the line 106g and the line 106h (i.e. at the gate of the n-channel field effect transistor 105b and at the gate of the n-channel field effect transistor 105d).

The delay time T1 caused by the input delay means 103c, 103d is chosen such that it corresponds substantially to the switching time (tipping time) T2 of the amplifier circuit 102, or is somewhat larger, respectively.

As results from FIG. 2a, with the level converter according to the present embodiment, the signal (B) that can be tapped at the second output 107b of the amplifier circuit 102 is supplied, via a line 109b, to an input of the output switching element 103b (here: the latch 103b), and the complementary signal (A) that can be tapped at the first output 107a of the amplifier circuit 102 is supplied, via a line 109a, to an input of the output switching element 103a (here: the latch 103a).

Each of the output switching elements or latches 103a, 103b, respectively, includes a first inverter, the input of which is connected with the input of the respective output switching element 103a, and the output of which is connected to the output of the respective output switching element 103a, as well as a second inverter feeding back the signal (bA, bB) output at the output of the respective first inverter of the respective output switching element 103a, 103b to the input of the respective first inverter of the respective output switching element 103a, 103b.

As is illustrated in FIGS. 2a and 2b, the signal (B) that can be tapped at the second output 107b of the amplifier circuit 102 is—except from being supplied to the input of the output switching element 103b via the line 109b—additionally supplied to a first control input of the transmission gate 113b via a line 111b.

Furthermore, the signal (bB) output at the output of the output switching element 103b is—via a line—110b—supplied to a second, complementary control input of the transmission gate 113b.

As is further illustrated in FIGS. 2a and 2b, the signal (A) that can be tapped at the first output 107a of the amplifier circuit 102 is—via a line 111a—supplied to a first control input of the transmission gate 113a.

Furthermore, the signal (bA) output at the output of the output switching element 103a is—via a line 110a—supplied to a second, complementary control input of the transmission gate 113a.

Furthermore—as is illustrated in FIGS. 2a and 2c—the signal (A) that can be tapped at the first output 107a of the amplifier circuit 102 is additionally supplied—also via the line 111a—to a first control input of the transmission gate 113c.

Moreover, the signal (bA) output at the output of the output switching element 103a is—additionally also supplied (also via the line 110a) to a second, complementary control input of the transmission gate 113c.

As is further illustrated in FIGS. 2a and 2c, the signal (B) that can be tapped at the second output 107b of the amplifier circuit 102 is additionally supplied—also via the line 111b—to a first control the transmission gate 113d.

Furthermore, the signal (dB) output at the output of the output switching element 103b is—via the above-mentioned line 110b—supplied to a second, complementary control input of the transmission gate 113d.

Each transmission gate 113a, 113b, 113c, 113d includes an n- and a p-channel field effect transistor, wherein the first control input of the respective transmission gate 113a, 113b is respectively connected to the gate of the first field effect transistor, and the second, complementary control input of the respective transmission gate 113a, 113b is respectively connected to the gate of the second field effect transistor.

As results from FIG. 2b, with the transmission gate 113a, the drain or the source, respectively, of the n- or the p-channel field effect transistor, respectively (i.e. the input or output of the transmission gate 113a, respectively) is connected to the ground (Gnd), or, via a line 114a, to a first output 112 of the level converter at which a first output signal (signal Out) corresponding to the input signal (in) is output.

Contrary to this, with the transmission gate 113b, the drain or the source, respectively, of the n- or p-channel field effect transistor, respectively (i.e. the input or output of the transmission gate 113b, respectively) is connected to the supply voltage (Vsupply), or, via a line 114b, to the above-mentioned first level converter output 112.

Correspondingly similar as with the transmission gate 113a, with the transmission gate 113d—as results from FIG. 2c—the drain or the source, respectively, of the n- or p-channel field effect transistor, respectively (i.e. the input or output of the transmission gate 113d, respectively) is connected to the ground (Gnd), or, via a line 114c, to a second output 115 of the level converter at which a second output signal (signal bOut) corresponding to the input signal (bin) is output.

Contrary to this, with the transmission gate 113c, the drain or the source, respectively, of the n- or p-channel field effect transistor, respectively (i.e. the input or output of the transmission gate 113c, respectively) is connected to the supply voltage (Vsupply), or, via a line 114d, to the above-mentioned second level converter output 115.

In order to compensate for the effect of differently long signal running times caused by the amplifier circuit 102 (which depend on whether the signal (in) applied at the input 106a of the amplifier circuit 102 changes from "logically low" to "logically high" ("positive" edge of the signal (in)), or—vice versa—from "logically high" to "logically low" ("negative" edge of the signal (in)) (or—correspondingly inversely—the signal (bin) applied at the input 106b of the amplifier circuit 102)), only the positive edges of the input signals (signal (in) and signal (bin)) are used for triggering the transmission gates 113a, 113b, 113c, 113d (or—alternatively—e.g. only the negative signal edges). With respect to the positive signal edges (or the negative signal edges, respectively), the signal running times occurring and caused by the amplifier circuit 102 are—due to the symmetrical construction of the amplifier circuit 102—substantially of equal duration.

When the internal signal (in) applied at the first input 106a of the amplifier circuit 102 changes from a "logically low" state to a "logically high" state (and the complementary internal signal (bin) from a state "logically high" to a state "logically low"), the signal (A) that can be tapped at the first output 107a of the amplifier circuit 102 changes, in accordance with FIGS. 3a and 3b, its state from "logically high" to "logically low", with the consequence that—since the transmission gate 113a will then be locking, and the transmission gate 113b will then be conducting—a "logically high" signal (Out) is output at the output 112 (and—since the transmission gate 113c will then be locking, and the transmission gate 113d will then be conducting—a "logically low" signal (bOut) is output at the output 115).

When the internal signal (bin) applied at the second input 106b of the amplifier circuit 102 changes from a "logically low" state to a "logically high" state (and the complementary internal signal (in) from a state "logically low" to a state "logically high"), the signal (B) that can be tapped at the amplifier circuit 102 changes, in accordance with FIGS. 3a and 3b, its state from "logically high" to "logically low", with the consequence that—since the transmission gate 113a will then be conducting, and the transmission gate 113b will then be locking—a "logically low" signal (Out) is output at the output 112 (and—since the transmission gate 113c will then be conducting, and the transmission gate 113d will then be locking—a "logically high" signal (bOut) is output at the output 115).

By the output switching elements or latches 103a, 103b, respectively, it is achieved that the corresponding levels (-during a "logically high" level at the output 107a or 107b, respectively) are maintained appropriately, so that a "floating" of the outputs 107a or 107b, respectively, is avoided.

By the fact that only the positive clock edges of the signal (in) and of the signal (bin) are used for triggering the transmission gates 113a, 113b, 113c, 113d, distortions of the output signals (Out or bOut, respectively) which otherwise result from running time differences caused by the amplifier circuit 102, may be avoided.

Furthermore, distortions contained in the input signals (in or bin, respectively) (which, for instance, result in that the "logically high" state of the signals in, bin may be shorter than the "logically low" state, or vice versa) may be compensated for by signal delays caused by the input delay means 103c, 103d.

What is claimed is:

1. A level converter for converting a signal having a first voltage level and supplied to the level converter, to an output signal having a second voltage level differing from the first voltage level, the level converter comprising:
    an amplifier device with a first and second cross-coupled transistor, and a first and a second pair of transistors, the transistors of the first pair of transistors being connected in series, and the transistors of the second pair of transistors being connected in series;
    a first delay device for creating a delayed signal from the signal, the delayed signal being inverse to the signal; and
    a second delay device for creating a further delayed signal from a further signal inverse to the signal, the further delayed signal being inverse to the further signal, wherein
    for compensating distortions included in the signal and the further signal inverse to the signal, the signal is fed to a first transistor of the first pair of transistors, the further signal inverse to the signal is fed to a first transistor of the second pair of transistors, the delayed signal inverse to the signal is fed to a second transistor of the first pair of transistors, and the further delayed signal inverse to the further signal is fed to a second transistor of the second pair of transistors.

2. The level converter according to claim 1, wherein, for generating the output signal having the second voltage level, the amplifier device is supplied with a second amplifier device output signal differing therefrom.

3. The level converter according to claim 1, further comprising a first transmission gate that is triggered with at least one of a first amplifier device output signal and a signal derived therefrom, and a second transmission gate that is triggered with at least one of a second amplifier device output signal and a signal derived therefrom.

4. The level converter according to claim 3, wherein the outputs of the transmission gates are connected with one another.

5. The level converter according to claim 1, further comprising an output switching element for inverting a first amplifier device output signal.

6. The level converter according to claim 5, wherein the first amplifier device output signal is latched by means of the output switching element.

7. The level converter according to claim 1, wherein the level converter comprises an output switching element for inverting a second amplifier device output signal.

8. The level converter according to claim 7, wherein the second amplifier device output signal is latched by the further output switching element.

9. The level converter according to claim 1, wherein the level converter is triggered by an edge of a first amplifier device output signal that changes from a first state to a second state, and wherein the level converter is triggered by an edge of the second amplifier device output signal, which is displaced with respect to time vis-à-vis the edge of the first amplifier device output signal.

10. The level converter according to claim 9, wherein the edge of the first amplifier device output signal effecting the triggering is a positive edge, and the edge of the second amplifier device output signal effecting the triggering is also a positive edge.

11. The level converter according to claim 9, wherein the edge of said first amplifier device output signal effecting the triggering is a negative edge, and the edge of the second amplifier device output signal effecting the triggering is also a negative edge.

12. The level converter according to claim 1, wherein the first voltage level is smaller than the second voltage level.

13. The level converter according to claim 12, wherein the first voltage level lies between 1.2 V and 1.9 V, and the second voltage level lies between 1.5 V and 2.5 V.

14. The level converter according to claim 1, wherein the amplifier device comprises a plurality of cross-coupled transistors.

15. The level converter according to claim 14, wherein the transistors are field effect transistors.

16. The level converter of claim 1, wherein the first delay device comprises an odd number of inverters.

17. The level converter of claim 16, wherein the second delay device comprises an odd number of inverters.

* * * * *

UNITED STATES PATENT AND TRADEMARK OFFICE
CERTIFICATE OF CORRECTION

PATENT NO. : 7,224,201 B2
APPLICATION NO. : 10/970664
DATED : May 29, 2007
INVENTOR(S) : Rao et al.

It is certified that error appears in the above-identified patent and that said Letters Patent is hereby corrected as shown below:

Column 1, line 27: Remove the second occurrence of the word "may";
Column 1, line 46: Insert the word --be-- between the words "instance," and "an";
Column 3, line 38: Replace the word "transistor" with the word --transistors--;
Column 4, line 56: Replace the word "last" with the word --lasts--;
Column 6, line 53: Replace the word "fist" with the word --first--;
Column 6, line 60: Replace the word "output" with the word --outputs--;
Column 7, line 53: Replace the words "is—additionally" with --is additionally--;
Column 7, line 59: Insert the words --input of-- between the words "control" and "the".

Signed and Sealed this

Twenty-fourth Day of July, 2007

JON W. DUDAS
*Director of the United States Patent and Trademark Office*